United States Patent [19]
Roberts et al.

[11] Patent Number: 5,204,141
[45] Date of Patent: Apr. 20, 1993

[54] DEPOSITION OF SILICON DIOXIDE FILMS AT TEMPERATURES AS LOW AS 100 DEGREE C. BY LPCVD USING ORGANODISILANE SOURCES

[75] Inventors: David A. Roberts, Carlsbad; Arthur K. Hochberg, Solana Beach, both of Calif.

[73] Assignee: Air Products and Chemicals, Inc., Allentown, Pa.

[21] Appl. No.: 762,101

[22] Filed: Sep. 18, 1991

[51] Int. Cl.$^5$ ............................................. C23C 16/00
[52] U.S. Cl. ............................. 427/255.3; 427/255.2; 427/255.1; 427/255; 427/314; 427/238
[58] Field of Search ............... 427/255.3, 255.2, 255.1, 427/255, 248.1, 314; 437/238, 235

[56] References Cited

U.S. PATENT DOCUMENTS 4,900,591  2/1990  Bennett et al. ..................... 427/255
4,923,716  5/1990  Brown et al. ....................... 427/249

OTHER PUBLICATIONS

Hochberg et al., "The LPCVD of Silicon Oxide Films below 400° C. from Liquid Sources" Journal of the Electrochemical Society, vol. 136, No. 6, Jun. 1989 pp. 1843-1844.

Goldsmith et al, "The Deposition of Vitreous Silicon dioxide films from Silane", RCA Review 28 (1967) pp. 153-165.

Primary Examiner—Shrive Beck
Assistant Examiner—Roy V. King
Attorney, Agent, or Firm—James C. Simmons; William F. Marsh

[57] ABSTRACT

Process for depositing films of silicon dioxide by a low pressure CVD method, utilizing 1,4 disilabutane as the silicon precursor and molecular oxygen as the oxygen source. The deposition process permits films to be put down on a substrate at temperatures as low as 100° C. with essentially no carbon in the film. The 1,4 disilabutane can be used as a substitute for silane, a toxic, pyrophoric compressed gas.

22 Claims, 2 Drawing Sheets

DEPOSITION OF SILICON DIOXIDE FILMS AT TEMPERATURES AS LOW AS 100 DEGREE C. BY LPCVD USING ORGANODISILANE SOURCES

FIELD OF THE INVENTION

This invention relates to the deposition of silicon dioxide films on various substrates and, specifically, to the deposition of silicon dioxide films in the manufacture of semiconductor devices.

BACKGROUND OF THE INVENTION

It is standard practice in the manufacture of many semiconductor devices, and other devices, to provide a thin passive layer or coating of a chemically nonreactive or low reactivity material to protect the semiconductor junctions and layers from degradation by contact with oxygen, fumes in the air, moisture, etc., and from damage by contact during packaging and handling and to stabilize the electrical characteristics of the device.

The production of silicon oxide coatings and their application to semiconductor devices and to other devices is well known, and there is considerable literature on the subject. The general principles underlying the formation of thin films are described in HANDBOOK OF THIN FILM TECHNOLOGY, Maissell, Leon I. and Glang, Reinhard, editors, McGraw Hill Book Company, New York, 1970, and the general technology for processing silicon-based semiconductor devices is described in SILICON PROCESSING FOR THE VLSI ERA, Wolf, Stanley, and Talbert, Richard N., editors, Lattice Press, Sunset Beach, Calif., 1986, which includes a discussion of thin film technology.

The low pressure chemical vapor deposition (LPCVD) process which will be discussed herein and which is of principle interest in this invention involves the deposition of films from gaseous reagents in the pressure range of from about 100 mtorr to about 1000 mtorr in most instances, with operation being possible up to about 2000 mtorr in some particular examples, the latter pressure being intermediate APCVD and LPCVD operation.

A large variety of "thin films" are used in the fabrication of Very Large Scale Integration (VLSI) devices. These films may be thermally grown or deposited from the vapor phase. They can be metals, semiconductors, or insulators.

Thin films for use in VLSI fabrication must satisfy a large set of rigorous chemical, structural and electrical requirements. Film composition and thickness must be strictly controlled to facilitate etching of submicron features. Very low densities of both particulate defects and film imperfections, such as pinholes, become critical for the small line widths, high densities, and large areas necessary for VLSI. The small geometries also create highly rugged topography for overlying films to cover. Therefore, excellent adhesion, low stress, and conformal step coverage are required of a VLSI thin film, and its own surface topography should reduce or even planarize the underlying steps, if possible. Finally, non-conducting thin films must have low dielectric constants to reduce parasitic capacitances exacerbated by the scaled-down film thicknesses.

Chemical Vapor Deposition (CVD) process can be summarized as consisting of the following sequence of steps: (a) a given composition and flow rate of reactant gases and diluent inert gases is introduced into a reaction chamber; (b) the gas species move to the substrate; (c) the reactants are adsorbed on the substrate; (d) the adatoms undergo migration and film-forming chemical reactions, and (e) the gaseous by-products of the reaction are desorbed and removed from the reaction chamber. Energy to drive the reactions can be supplied by several methods; e.g., thermal, photons, or electrons, with thermal energy being the most commonly used.

In practice, the chemical reactions of the reactant gases leading to the formation of a solid material may take place not only on or very close to the wafer surface, a heterogeneous reaction, but also in the gas phase, a homogeneous reaction. Heterogeneous reactions are much more desirable, as such reactions occur selectively only on heated surfaces, and produce good quality films. Homogeneous reactions, on the other hand, are undesirable, as they form gas phase clusters of the depositing material, which can result in poorly adhering, low density films, or defects in the depositing film. In addition, such reactions also consume reactants and can cause decreases In deposition rates. Thus, one important characteristic of a chemical reaction for CVD application is the degree to which heterogeneous reactions are favored over gas phase reactions.

Since the aforementioned steps of a CVD process are sequential, the one which occurs at the slowest rate will determine the rate of deposition. The steps can be grouped into (1) gas-phase processes, and (2) surface processes. The gas phase phenomenon of interest is the rate at which gases impinge on the substrate. This is modeled by the rate at which gases cross the boundary layer that separates the bulk regions of flowing gas and substrate surface. Such transport processes occur by gas-phase diffusion, which is proportional to the diffusivity of the gas, D, and concentration gradient across the boundary layer. The rate of mass transport is only relatively weakly influenced by temperature.

Several surface processes can be important once the gases arrive at the hot substrate surface, but the surface reaction, in general, can be modeled by a thermally activated phenomenon which proceeds at a rate which is a function of the frequency factor, the activation energy, and the temperature. The surface reaction rate increases with increasing temperature. For a given surface reaction, the temperature may rise high enough so that the reaction rate exceeds the rate at which reactant species arrive at the surface. In such cases, the reaction cannot proceed any more rapidly than the rate at which reactant gases are supplied to the substrate by mass transport, no matter how high the temperature is increased. This situation is referred to as a mass-transport limited deposition process.

On the other hand, at lower temperatures, the surface reaction rate is reduced, and eventually the arrival rate of reactants exceeds the rate at which they are consumed by the surface reaction process. Under such conditions the deposition rate is reaction rate limited. Thus, at high temperatures, the deposition is usually mass-transport limited, while at lower temperatures it is surface-reaction rate-limited. In actual processes, the temperature at which the deposition condition moves from one of these growth regimes to the other is dependent on the activation energy of the reaction, and the gas flow conditions in the reactor. Thus, it is impossible to extrapolate with any certainty or accuracy data or process conditions or results from one pressure regime or temperature regime to another.

In processes that are run under reaction rate-limited conditions, the temperature of the process is an important parameter. That is, uniform deposition rates throughout a reactor require conditions that maintain a constant reaction rate. This, in turn, implies that a constant temperature must also exist everywhere at all wafer surfaces. On the other hand, under such conditions, the rate at which reactant species arrive at the surface is not as important, since their concentration does not limit the growth rate. Thus, it is not as critical that a reactor be designed to supply an equal flux of reactants to all locations of a wafer surface. It will be seen that in low-pressure CVD (LPCVD) reactors, wafers can be stacked vertically and at very close spacing because such systems operate in a reaction rate limited mode. The reason for this is as follows:

Under the low pressure of an LPCVD reactor $\sim 1$ torr the diffusivity of the gas species is increased by a factor of 1000 over that at atmospheric pressure, and this is only partially offset by the fact that the boundary layer, the distance across which the reactants must diffuse, increases by less than the square root of the pressure. The net effect is that there is more than an order of magnitude increase in the transport of reactants to and by-products away from the substrate surface, and the rate-limiting step is thus the surface reaction.

CVD systems usually contain the following components: (a) gas sources; (b) gas feed lines; (c) mass-flow controllers for metering the gases into the system; (d) a reaction chamber or reactor; (e) a method for heating the wafers onto which the film is to be deposited, and in some types of systems, for adding additional energy by other means; and (f) temperature sensors.

LPCVD reactors are designed in two primary configurations: (a) horizontal tube reactors; and (b) vertical flow isothermal reactors.

Horizontal tube, hot wall reactors are the most widely used LPCVD reactors in VLSI processing. They are employed for depositing poly-Si, silicon nitride, and undoped and doped $SiO_2$ films. They find such broad applicability primarily because of their superior economy, throughput, uniformity, and ability to accommodate large diameter, e.g. 150 mm wafer. Their main disadvantages are susceptibility to particulate contamination and low deposition rates.

The vertical flow isothermal LPCVD reactor further extends the distributed gas feed technique, so that each wafer receives an identical supply of fresh reactants. Wafers are again stacked side by side, but are placed in perforated-quartz cages. The cages are positioned beneath long, perforated, quartz reaction-gas injector tubes, one tube for each reactant gas. Gas flows vertically from the injector tubes through the cage perforations, past the wafers, parallel to the wafer surface and into exhaust slots below the cage. The size, number, and location of cage perforations are used to control the flow of reactant gases to the wafer surfaces. By properly optimizing cage perforation design, each wafer can be supplied with identical quantities of fresh reactants from the vertically adjacent injector tubes. Thus, this design can avoid the wafer-to-wafer reactant depletion effects of the end-feed tube reactors. requires no temperature ramping, produces highly uniform depositions, and reportedly achieves low particulate contamination.

Chemical vapor deposition (CVD) $SiO_2$ films, and their binary and ternary silicates, find wide use in VLSI processing. These materials are used as insulation between polysilicon and metal layers, between metal layers in multilevel metal systems, as getters, as diffusion sources, as diffusion and implantation masks, as capping layers to prevent outdiffusion, and as final passivation layers. In general, the deposited oxide films must exhibit uniform thickness and composition, low particulate and chemical contamination, good adhesion to the substrate, low stress to prevent cracking, good integrity for high dielectric breakdown, conformal step coverage for multilayer systems, low pinhole density, and high throughout for manufacturing.

CVD silicon dioxide is an amorphous structure of $SiO_4$ tetrahedra with an empirical formula $SiO_2$. Depending on the deposition conditions, as summarized in Table 2, CVD silicon dioxide may have lower density and slightly different stoichiometry from thermal silicon dioxide, causing changes in mechanical and electrical film properties, such as index of refraction, etch rate, stress, dielectric constant and high electric-field breakdown strength. Deposition at high temperatures, or use of a separate high temperature post-deposition anneal step, referred to as densification can made the properties of CVD films approach those of the thermal oxide.

The low temperature deposition of $SiO_2$ utilizes a reaction of silane and oxygen to form undoped $SiO_2$ films. The depositions are carried out in APCVD reactors, primarily of the continuous belt type, in distributed feed LPCVD reactors, or in PECVD reactors. The depletion effect precludes the use of conventional LPCVD for the $SiH_4 + O_2$ reaction. The addition of $PH_3$ to the gas flow forms $P_2O_5$, which is incorporated into the $SiO_2$ film to produce a phosphosilicate glass (PSG). The reactions are given by:

$$SiH_4 + O_2 \rightarrow SiO_2 + 2H_2$$

$$4PH_3 + 5O_2 \rightarrow 2P_2O_5 + 6H_2$$

The reaction between silane and excess oxygen forms $SiO_2$ by heterogeneous surface reaction. Homogeneous gas-phase nucleation also occurs, leading to small $SiO_2$ particles that form a white powder on the reaction chamber walls, and which may potentially cause particulate contamination in the deposited films.

The deposition rate increases slowly with increased temperature between 310° and 450° C. An apparent activation energy of less than 0.4 eV has been measured which is indicative of a surface adsorption or gas phase diffusion deposition process. The deposition rate can be increased at constant temperature, up to a limit by increasing the $O_2:SiH_4$ ratio. Continued increase in the ratio eventually results in a decrease in deposition rate, as a result of $O_2$ being adsorbed on the substrate, thus inhibiting the $SiH_4$ decomposition.

Silicon dioxide films deposited at low temperatures exhibit lower densities than thermal $SiO_2$, and have an index of refraction of $\sim 1.44$. They also exhibit substantially higher etch rates in buffered hydrofluoric acid than thermal $SiO_2$. Subsequent heating of such films to temperatures between 700°-1,000° C. causes densification. That is, this step causes the density of the material to increase from 2.1 g/cm$^3$ to 2.2 g/cm$^3$ the film thickness to decrease, and the etch rate in HF to decrease temperature and rate. Dielectric strengths of $4-8 \times 10^6$ V/cm, and dielectric constants ranging from 4-5 have been obtained. Low pinhole counts have been obtained with PECVD oxides, as have very conformal coatings. Adhesion to metal is also reported to be excellent.

In the medium temperature range, SiO₂ is deposited in LPCVD reactors by decomposing tetraethoxysilane, Si(OC₂H₅)₄, also known as tetraethyl orthosilicate, or TEOS. The deposition rate for TEOS shows an exponential increase with temperature in the range of 650°–800° C. with an apparent activation energy of 1.9 eV. This pronounced temperature dependence can lead to thickness control problems. The deposition rate is also dependent on the TEOS partial pressure. It is linearly dependent at low partial pressures, and tends to level off as the adsorbed TEOS saturates the surface. TEOS films generally show excellent conformality.

At high temperatures, near 900° C., SiO₂ is formed by an LPCVD process in which dichlorosilane and nitrous oxide are reacted. The reaction is given by:

$$SiH_2Cl_2 + 2N_2O \rightarrow SiO_2 + 2N_2 + 2HCl.$$

Such depositions produce films having excellent uniformity, and with properties close to those of thermal SiO₂. High temperature LPCVD is sometimes used to deposit SiO₂ over poly-Si.

Low temperature depositions of SiO₂ films using various silicon precursors is summarized in Table I. As is indicated only diethylsilane and silane have been shown to deposit at temperatures below 400° C. upon reaction with oxygen. In practice, LPCVD reaction temperatures exceeding 400° C. are required to achieve practical rates of film deposition with both of these sources.

TABLE I

Precursors for LPCVD SiO₂ Film Depositions

| Chemical | Temp. | Ref. |
|---|---|---|
| Diethylsilane | >325° C. | J. Electrochem Soc. 136, 1843 (198) AK Hochberg DL, O'Meara |
| 2,4,6,8 Tetramethylcyclo-tetrasiloxane (TMCTS) | >550° C. | Electrochem. Soc. Ext. Abstract No. 239, 88-2, 335 (1988) AK Hochberg, et al. |
| Diacetoxyditertiary-butoxysilane (DADBS) | >400° C. | G. Smolinsky & R. E. Dean Mater, Lett. 4, 256 (1986) |
| Silane | >350° C. | J. L. Vossen and W. Kern eds. Thin Film Processes Academic 1978 |

SUMMARY OF THE INVENTION

The present invention is a method of depositing substantially pure thin silicon oxide films onto silicon, metallic and ceramic substrates by using novel silicon presursor sources. According to the method, the thin and substantially pure silicon oxide films are chemical vapor deposited on many different substrates including silicon, ceramics and metals under subatmospheric pressure conditions within the range of 0.05 torr to 1 torr, at a temperature of about 95° C. to about 500° C. using a mixture of process gases comprising an alkyldisilane, oxygen and optionally an inert gas diluent such as nitrogen or argon.

According to the present invention thin silicon oxide, SiO₂ films can be deposited using a wide range of process conditions and a variety of organohydrodisilane compounds. More specifically, by conjunctively controlling various interdependent operating parameters, especially the reaction temperature within the range of about 95° C. to about 500° C., the molar feed ratio of the alkyldisilane to oxygen within the range of 1:1 to about 1:15 and the specific makeup of the alkyldisilane compound it is possible to deposit thin silicon oxide films which are substantially free of carbon. The alkyldisilane sources are typically nonpyrophoric liquids which are safer to handle than silane which is currently used for the low temperature deposition of silica films. Surprisingly, the alkyldisilanes permit the deposition of SiO₂ at very low temperatures which permit silica coatings to be put down upon temperature sensitive substrates such as aluminum metal and photoresist. Another application is for a film that seals the surface of volatile materials, e.g. Ga, As, Hg, Ca, Te.

According to the invention, silicon oxide films are produced by the chemical vapor deposition, CVD, process using a mixture of oxygen and a organodisilane of the general formulas:

H₃Si—CH(R)—(CH(R'))ᵧ—CH(R")—SiH₃ where y=0,1,2,3,4,5,6 R, R', R" are independently selected from the group H, Cl–C3 hydrocarbon
H₃Si—(CH₂)ₓ—SiH₃ where x is 2,3,4,5, or 6

DETAILED DESCRIPTION OF THE INVENTION

Figure 1:
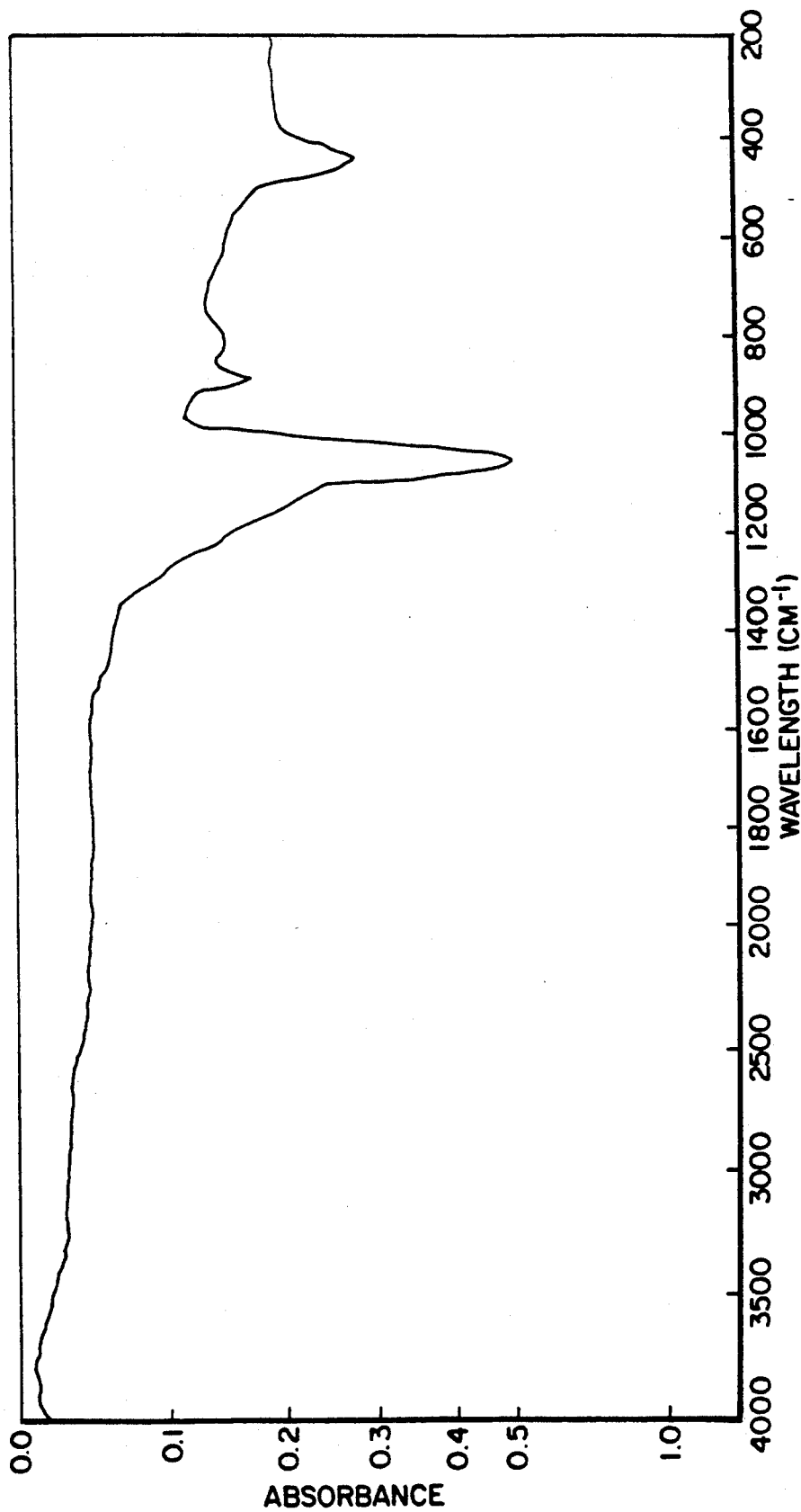
FIG. 1 is plot of the infrared spectrum (absorbence against wave length) for a film deposited according to the present invention.

The present invention relates to the manufacture of devices in which thin films of silicon oxides, SiO₂ principally, are deposited on substrates. Economically, the greatest industrial application of this invention is in the manufacture of semiconductor devices; however, the discoveries of this invention are applicable to any thin film deposition of SiO₂ on substrates which are capable of being heated to temperatures in the range of from about 95° C. to about 600° C.

The fabrication of silicon based integrated circuits is dependent upon the layering of conductive, semiconductive and insulating films. One of the key advantages of silicon microelectronic technology is the good qualities of silicon dioxide (SiO₂) to act as an insulating layer in a number of applications. One of the more relevant applications of this invention is as an insulating layer between two metal films i.e. interlevel dielectric.

As an interlevel dielectric the SiO₂ prevents shorting of electrical signals between two metal levels. One of the preferred methods for applying this SiO₂ film is by chemical vapor deposition (CVD) in which a volatile silicon bearing species e.g. SiH₄ is reacted with oxygen in the gas phase to deposit SiO₂ thin films. The energy required for this reaction can be supplied by either a plasma or simple resistive heating. However, simple resistive heating is advantageous because the equipment is less expensive than that required for plasma type reactions and one avoids radiative film damage often associated with plasma reactors.

A disadvantage of the thermal chemistry is that the temperature of the reactor is typically greater than 350° C. in order to achieve good film depositions rates. The lowest temperature SiO₂ source is silane, SiH₄, which can undergo decomposition at relatively low temperatures but higher deposition temperatures are typically employed to get the best film properties. Furthermore, silane is a pyrophoric, toxic, compressed gas. Many tragic accidental explosions of silane have occurred over the years. While SiH4 can react at temperatures as low as those reported here, the film quality is generally not acceptable at temperatures below 350° C. and silane processes are operated at the higher temperatures, approximately 425° C. Low temperatures e.g. <400° C. with LPCVD deposition rates >100 Å/min are required for very temperature sensitive situations such as $SiO_2$ over Al or where shallow junction devices are being constructed. In these cases the present invention would seem to be ideally suited.

The process of the invention relates to depositing substantially pure thin silicon oxide films onto silicon, metallic, ceramic, and polymer substrates by using novel silicon precursor sources. According to the method, the thin and substantially pure silicon oxide films are chemical vapor deposited on many different substrates including silicon, ceramics and metals under sub-atmospheric pressure conditions within the range of 0.05 torr to 1 torr, at a temperature of about 95° C. to about 500° C. using a mixture of process gases comprising an alkyldisilane, oxygen and optionally an inert gas diluent such as nitrogen or argon.

Thin silicon oxide, $SiO_2$ films can be deposited using a wide range of process conditions and a variety of organohydrodisilane compounds. More specifically, by conjunctively controlling various interdependent operating parameters, especially the reaction temperature within the range of about 95° C. to about 500° C., the molar feed ratio of the alkyldisilane to oxygen within the range of 1:1 to about 1:15 and the specific makeup of the alkyldisilane compound it is possible to deposit thin silicon oxide films which are substantially free of carbon. The alkyldisilane sources are typically nonpyrophoric liquids which are safer to handle than silane which is currently used for the low temperature deposition of silica films. Surprisingly, the alkyldisilanes permit the deposition of $SiO_2$ at very low temperatures which permit silica coatings to be put down upon temperature sensitive substrates such as aluminum metal.

According to the invention silicon oxide films are produced by the chemical vapor deposition, CVD, process using a mixture of oxygen and a organodisilane of the general formulas:

$H_3Si—CH(R)—(CH(R'))_y—CH(R'')—SiH_3$ where y=0,1,2,3,4,5,6 R, R', R'' are independently selected from the group H, C1-C3 hydrocarbon $H_3Si—(CH_2)_x—SiH_3$ where x=2,3,4,5,6

Several low temperature oxide precursors were tried in order to achieve a low temperature deposition process. These are set out below in Table II along with the deposition temperatures.

TABLE II

| PRECURSOR | MINIMUM DEPOSITION TEMPERATURE |
|---|---|
| n-butylsilane: | >340° C. |
| diethylsilane: | >340° C. |
| t-butylsilane | >350° C. |
| di-t-butylsilane | >420° C. |
| tetraethoxysilane | >610° C. |
| Diacetoxyditertiary butoxysilane | >400° C. |

In a preferred embodiment of the invention using an LPCVD process, 1,4 disilabutane and oxygen are flowed over wafers in an evacuated chamber. The chamber is heated from 95° to 400° C. and the flow of the oxygen and silicon source are controlled so that the ratios of $O_2$ to silicon source is equal to or greater than 2:1. A continuous film of $SiO_2$ is deposited upon the surface of a silicon wafer. These films are suitable for integrated circuit manufacture.

The preferred embodiment of the process of the invention was carried out in a vacuum, at pressures ranging from 0.1 to 0.5 torr and in a temperature range of about 95° to 400° C. A typical run was carried out in a 150 mm hot wall LPCVD horizontal tube reactor, although the apparatus configuration is not critical. The substrate was a [100] silicon wafer with a disilabutane (DSB) feed rate of from about 10 to 60 sccm and an $O_2$:DSB ratio from 1.2:1 to 10:1. It is preferred to use higher ratios to minimize carbon incorporation in the deposited films.

Table III is a summary of several deposition runs giving reaction conditions and depositions rates. It is believed that a 'wall' reaction is required to form the precursor that is oxidized on the wafer surface. This reaction is more favorable at high temperatures. Thus, as the temperature is increased for a fixed set of gas flow conditions, the pressure must be reduced to prevent homogeneous reactions and to move the deposition zone into the wafer region of the reactor.

TABLE III

| dep.T[1] (°C.) | $O_2$:DSB Ratio | DSB flow (SCCM) | injector | max dep rate (Å/min) | total P (torr) |
|---|---|---|---|---|---|
| 100 | 8:1 | 23 | yes | 101 | 0.200 |
| 100 | 8:1 | 23 | yes | 217 | 0.500 |
| 100 | 2:1 | 23 | yes | 100 | 0.200 |
| 150 | 2:1 | 23 | yes | 150 | 0.200 |
| 150 | 8:1 | 23 | yes | 180 | 0.200 |
| 200 | 8:1 | 23 | yes | 133 | 0.200 |
| 260 | 2:1 | 27 | no | 70* | 0.150 |
| 280 | 2:1 | 28 | yes | 140 | 0.150 |
| 280 | 3:1 | 28 | yes | 240 | 0.166 |
| 280 | 4:1 | 28 | yes | 360 | 0.200 |
| 280 | 5:1 | 28 | yes | 500 | 0.230 |
| 280 | 5:1 | 20 | yes | 260 | 0.190 |
| 280 | 5:1 | 16 | yes | 180 | 0.165 |
| 280 | 6:1 | 13 | yes | 215 | 0.190 |
| 280 | 8:1 | 13 | yes | 242 | 0.220 |
| 300 | 6:1 | 13 | yes | 185 | 0.175 |
| 300 | 1.2:1 | 54 | yes | 248 | 0.200 |
| 300 | 4:1 | 13 | yes | 160 | 0.175 |
| 380 | 2:1 | 27 | no | 70* | 0.200 |

[1]Deposition Temperature
*Deposition rate on wafers is low because high reactivity at this temperature caused deposition to occur upstream of the wafer load.

The process involves loading the quartz reactor with 75 to 100 silicon wafers; evacuating the system; letting the wafers come to temperature and then flowing the metered gases of oxygen and 1,4 disilabutane separately into the reactor. Film quality was improved when an injector tube was used to deliver the DSB along the wafer load. This prevented extensive reaction at a single oxygen mixing point and thus improved deposition uniformity.

Figure 2:
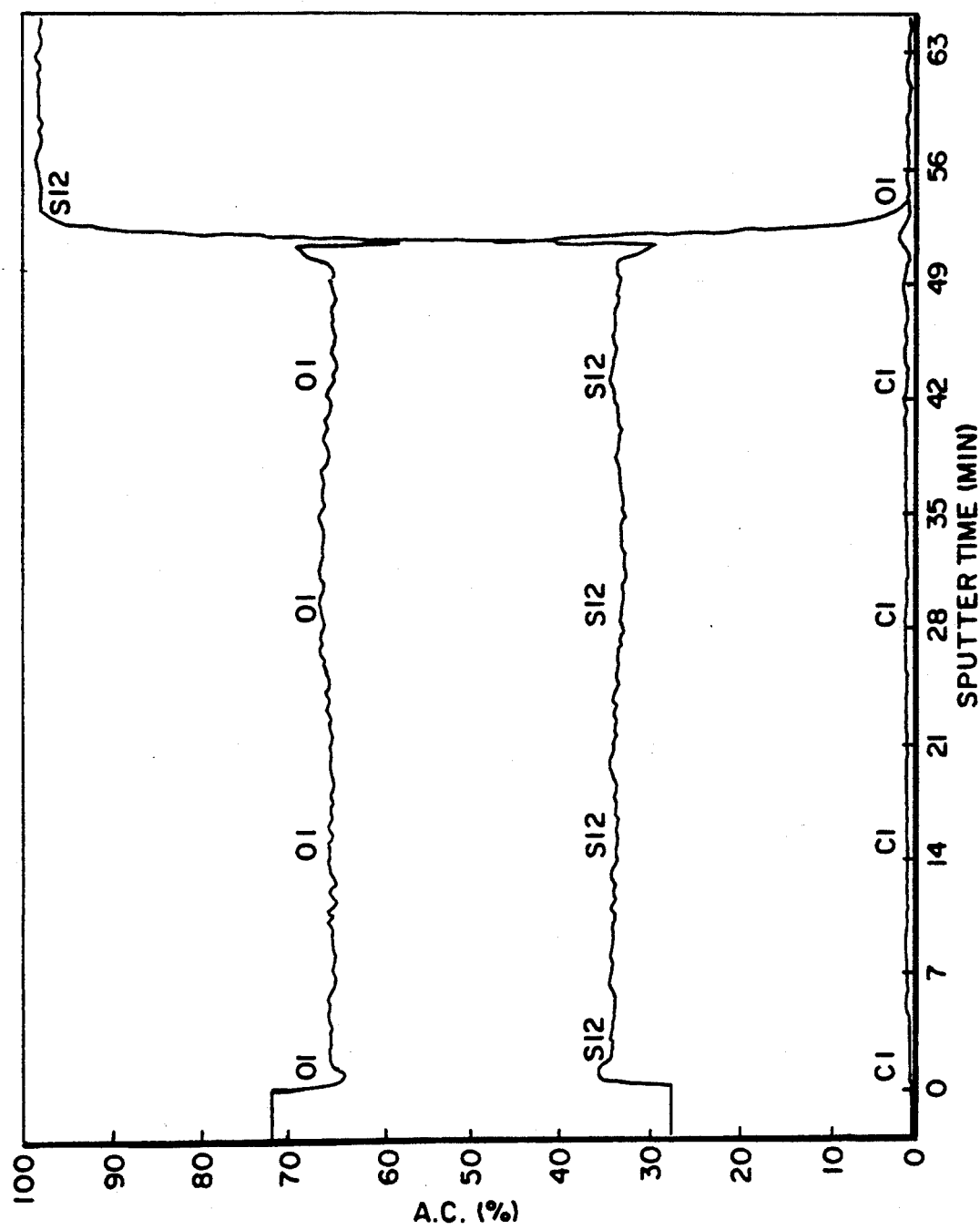
FIG. 2 is an Auger Profile (plot of atomic percent against sputter time) of a film deposited according to the present invention.

The films are characterized by infrared spectroscopy Auger electron spectroscopy refractive index. An IR spectrum of a typical film is shown in FIG. 1. The spectrum is consistent with $SiO_2$ films deposited from other known oxide precursors e.g. diethylsilane. There are no strong absorptions in the Si—H stretching region or in the 3200 cm$^{-1}$ region where C—H stretching might show up. FIG. 2 shows an Auger profile of a film deposited at 150° C. The ratio of Si to $O_2$ is consistent with stoichiometric $SiO_2$. The carbon signal is at the noise level of the system.

The process of the invention permits the deposition of silicon oxide thin films, suitable for the manufacture of integrated circuits at a range of temperatures that extends below 100° C. This is not necessarily the lowest possible deposition temperature. The equipment used for the evaluation was not reliable below 95° C. In addition to deposition on semi-conductor metals such as gallium arsenide and indium phosphide, the process of the invention can be used to deposit films on metals, plastics such as polyimides, insulators, dielectrics and photoresist materials such as polymethylmethacrylate. The foregoing examples are illustrative only of the wide applicability of the present invention.

Although the detailed mechanism is not fully understood, the unique low temperature decomposition to give silicon oxide is derived from the specific type of organosilane precursor. We have been unable to achieve a similar performance out of seemingly similar organo- silanes e.g. diethylsilane, t-butylsilane.

The chemistry is believed to be described by the following reaction: $H_3SiCH_2CH_2SiH_3 + O_2 \rightarrow SiO_2 + H_2 + H_2 +$ Acetylene + Other Carbon Species However, reaction products other than the $SiO_2$ film have not been observed.

The principal difference between the present invention and the prior art is the chemical nature of the precursor. The 1,4 disilabutane deposits good quality $SiO_2$ films, e.g. <100° C. at low temperatures. This is much lower than the low temperature of deposition associated with pyrophoric, toxic, gaseous silane, however, the new precursor is a non pyrophoric volatile liquid.

Having thus described our invention what is desired to be secured a Letters Patent of the United States is set forth in the appended claims.

We claim:

1. A low temperature chemical vapor deposition process comprising the steps of:
heating a substrate to a temperature of from about 95° C. to about 380° C. in a vacuum;
introducing into the vacuum a silicon-containing feed and an oxygen containing feed, said silicon containing feed consisting essentially of an organodisilane having the general formula $H_3Si$—$CH(R)$—$[CH(R')]y$—$CH(R'')$—$SiH_3$ wherein
y is 0, 1, 2, 3, 4, 5, 6 and
R, R', and R'' are independently selected from the group consisting essentially of H and $C_1$-$C_3$ hydrocarbon; and
maintaining said temperature and vacuum condition thereby causing a film of silicon dioxide to deposit on said substrate.

2. A process according to claim 1 wherein said oxygen containing feed is oxygen gas.

3. A process according to claim 2 wherein the ratio of said oxygen gas to said organodisilane is between 1:1 and 15:1.

4. A process according to claim 1 wherein the organodisilane has the general formula $H_3Si$—$(CH_2)_x$—$SiH_3$ wherein x is 2,3,4,5 or 6.

5. A process according to claim 1 wherein the organodisilane is 1,4 disilabutane.

6. A process according to claim 5 wherein the temperature is maintained at about 100° C.

7. A process according to claim 6 wherein the vacuum is maintained at between 0.5 and 1.5 torr.

8. A process according to claim 1 wherein the substrate is a silicon wafer.

9. A process according to claim 1 wherein the substrate is selected from the group consisting of metals, plastics, insulators, dielectrics, photoresist materials and semi-conductor materials.

10. A low temperature chemical vapor deposition process comprising the steps of:
heating a substrate to a temperature of from about 95° C. to about 380° C. in a vacuum;
introducing into the vacuum a silicon-containing feed and an oxygen-containing feed, said silicon containing feed consisting essentially of an organodisilane having the general formula $H_3Si$—$(CH_2)_x$—$SiH_3$ wherein x is 2,3,4,5 or 6; and
maintaining said temperature and vacuum conditions thereby causing a film of silicon dioxide to deposit on said substrate.

11. A process according to claim 10 wherein said oxygen containing feed is oxygen gas.

12. A process according to claim 11 wherein the ratio of said oxygen gas to said organodisilane is between 1:1 and 15:1.

13. A process according to claim 10 wherein the organodisilane is 1,4 disilabutane.

14. A process according to claim 10 wherein the temperature is maintained at about 100° C.

15. A process according to claim 10 wherein the vacuum is maintained at between 0.05 and 1.5 torr.

16. A process according to claim 10 wherein the substrate is a silicon wafer.

17. A process according to claim 10 wherein the organodisilane is 1,4 disilabutane and the temperature is between 100° C. and 380° C.

18. A process according to claim 10 wherein the substrate is selected from the group consisting of metals, plastics, insulators, dielectrics, photoresist materials and semi-conductor materials.

19. A low temperature chemical vapor deposition process comprising the steps of:
heating a substrate to a temperature of from about 95° C. to about 380° C. in a vacuum;
introducing into the vacuum 1,4 disilabutane and oxygen gas; and
maintaining said temperature and vacuum condition thereby causing a film of silicon dioxide to deposit on said substrate.

20. A process according to claim 19 wherein the temperature is between 100° C. and 380° C.

21. A process according to claim 19 wherein the vacuum is maintained between 0.5 and 1.5 torr.

22. A process according to claim 19 wherein the substrate is selected from the group consisting of metals, plastics, insulators, dielectrics, photoresist materials and semi-conductor materials.

* * * * *